US010503328B2

(12) United States Patent
Blondin et al.

(10) Patent No.: US 10,503,328 B2
(45) Date of Patent: Dec. 10, 2019

(54) DEVICE AND METHOD FOR GENERATING AN ELECTRICAL POWER SUPPLY IN AN ELECTRONIC SYSTEM WITH A VARIABLE REFERENCE POTENTIAL

(71) Applicant: QUICKSTEP TECHNOLOGIES LLC, Wilmington, DE (US)

(72) Inventors: Christophe Blondin, Nimes (FR); Christian Neel, Nimes (FR); Didier Roziere, Nimes (FR)

(73) Assignee: QUICKSTEP TECHNOLOGIES LLC, Wilmington, DE (US)

(*) Notice: Subject to any disclaimer, the term of this patent is extended or adjusted under 35 U.S.C. 154(b) by 231 days.

(21) Appl. No.: 15/489,522

(22) Filed: Apr. 17, 2017

(65) Prior Publication Data

US 2017/0220156 A1 Aug. 3, 2017

Related U.S. Application Data

(63) Continuation of application No. 14/126,163, filed as application No. PCT/FR2012/051288 on Jun. 8, 2012, now Pat. No. 9,640,991.

(30) Foreign Application Priority Data

Jun. 16, 2011 (FR) ..................................... 11 55285

(51) Int. Cl.
*G06F 3/044* (2006.01)
*H02M 7/06* (2006.01)
(Continued)

(52) U.S. Cl.
CPC ............ *G06F 3/044* (2013.01); *G06F 3/0416* (2013.01); *H02J 1/08* (2013.01); *H02M 7/02* (2013.01);
(Continued)

(58) Field of Classification Search
CPC combination set(s) only.
See application file for complete search history.

(56) References Cited

U.S. PATENT DOCUMENTS 4,526,043 A 7/1985 Boie
4,571,454 A 2/1986 Tamaru et al.
(Continued)

FOREIGN PATENT DOCUMENTS

CN 1202254 A 12/1998
CN 2012-18943 Y 4/2009
(Continued)

OTHER PUBLICATIONS

Final Office Action dated Jan. 15, 2015, for U.S. Appl. No. 14/354,334, filed Apr. 25, 2014, 23 pages.
(Continued)

*Primary Examiner* — Daniel Kessie
(74) *Attorney, Agent, or Firm* — Kubota & Basol LLP

(57) ABSTRACT

A method and device for generating a power supply voltage, referenced to a first reference potential, in an electronic system including an energizing source connected to the first and second reference potentials so as to impart an AC voltage differential between the reference potentials, wherein the device includes: (i) a source for supplying AC voltage, which is referenced to the second reference potential, connected to the first reference potential, and encompasses the energizing source; and (ii) rectifying and filtering elements connected, at the input thereof, to the first reference potential and to the source for supplying AC voltage, respectively, so as to generate, at an output, a power supply voltage (Vf) referenced to the first reference potential by rectifying a voltage at the terminals of the source for supplying AC voltage.

16 Claims, 3 Drawing Sheets

Figure 1:
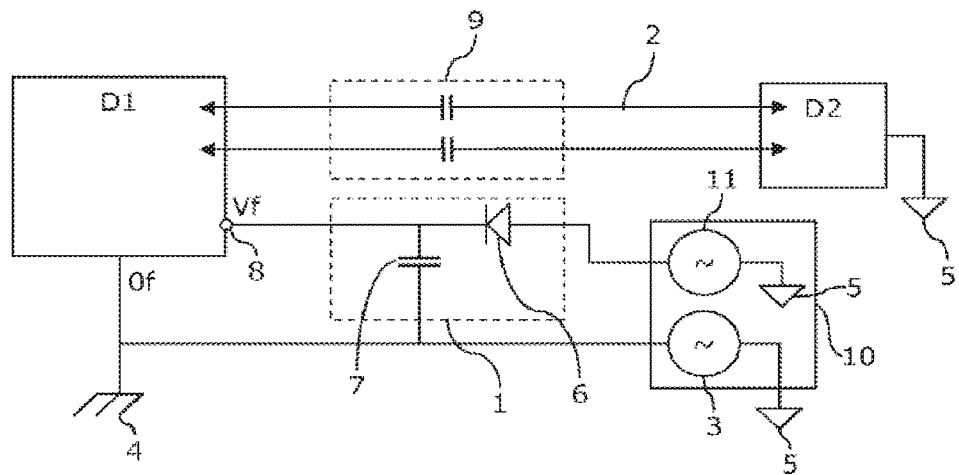

(51) Int. Cl.
*H02J 1/08* (2006.01)
*G06F 3/041* (2006.01)
*H02M 7/02* (2006.01)
*H03K 17/96* (2006.01)

(52) U.S. Cl.
CPC .......... *H02M 7/06* (2013.01); *H03K 17/9622* (2013.01); *H03K 2217/9607* (2013.01); *H03K 2217/960745* (2013.01); *Y10T 307/305* (2015.04); *Y10T 307/549* (2015.04)

(56) References Cited

U.S. PATENT DOCUMENTS

| | | |
|---|---|---|
| 4,686,332 A | 8/1987 | Greanias et al. |
| 4,698,461 A | 10/1987 | Meadows et al. |
| 4,700,022 A | 10/1987 | Salvador et al. |
| 4,922,061 A | 5/1990 | Meadows et al. |
| 5,062,198 A | 11/1991 | Sun |
| 5,083,118 A | 1/1992 | Kazama |
| 5,113,041 A | 5/1992 | Blonder et al. |
| 5,305,017 A | 4/1994 | Gerpheide |
| 5,442,347 A | 8/1995 | Vranish |
| 5,483,261 A | 1/1996 | Yasutake |
| 5,488,204 A | 1/1996 | Mead et al. |
| 5,528,267 A | 6/1996 | Ise |
| 5,543,588 A | 8/1996 | Bisset et al. |
| 5,565,658 A | 10/1996 | Gerpheide et al. |
| 5,648,642 A | 7/1997 | Miller et al. |
| 5,650,597 A | 7/1997 | Redmayne |
| 5,825,352 A | 10/1998 | Bisset et al. |
| 5,835,079 A | 11/1998 | Shieh |
| 5,841,427 A | 11/1998 | Teterwak |
| 5,844,506 A | 12/1998 | Binstead |
| 5,847,690 A | 12/1998 | Boie et al. |
| 5,861,875 A | 1/1999 | Gerpheide |
| 5,869,791 A | 2/1999 | Young |
| 5,880,411 A | 3/1999 | Gillespie et al. |
| 5,889,236 A | 3/1999 | Gillespie et al. |
| 5,914,465 A | 6/1999 | Allen et al. |
| 5,920,309 A | 7/1999 | Bisset et al. |
| 5,942,733 A | 8/1999 | Allen et al. |
| 6,025,647 A | 2/2000 | Shenoy et al. |
| 6,128,045 A | 10/2000 | Anai |
| 6,188,391 B1 | 2/2001 | Seely et al. |
| 6,204,897 B1 | 3/2001 | Colgan et al. |
| 6,232,937 B1 | 5/2001 | Jacobsen et al. |
| 6,236,386 B1 | 5/2001 | Watanabe |
| 6,239,788 B1 | 5/2001 | Nohno et al. |
| 6,297,811 B1 | 10/2001 | Kent |
| 6,310,610 B1 | 10/2001 | Beaton et al. |
| 6,323,846 B1 | 11/2001 | Westerman et al. |
| 6,417,627 B1 | 7/2002 | Derraa |
| 6,452,514 B1 | 9/2002 | Philipp |
| 6,492,979 B1 | 12/2002 | Kent et al. |
| 6,587,358 B1 | 7/2003 | Yasumura |
| 6,690,387 B2 | 2/2004 | Zimmerman et al. |
| 6,847,354 B2 | 1/2005 | Vranish |
| 6,888,536 B2 | 5/2005 | Westerman et al. |
| 6,891,531 B2 | 5/2005 | Lin |
| 6,943,705 B1 | 9/2005 | Bolender et al. |
| 6,970,160 B2 | 11/2005 | Mulligan et al. |
| 7,015,894 B2 | 3/2006 | Morohoshi |
| 7,030,860 B1 | 4/2006 | Hsu et al. |
| 7,098,897 B2 | 8/2006 | Vakil et al. |
| 7,129,935 B2 | 10/2006 | Mackey |
| 7,184,064 B2 | 2/2007 | Zimmerman et al. |
| 7,218,314 B2 | 5/2007 | Itoh |
| 7,236,161 B2 | 6/2007 | Geaghan et al. |
| 7,339,579 B2 | 3/2008 | Richter et al. |
| 7,356,575 B1 | 4/2008 | Shapiro |
| 7,362,313 B2 | 4/2008 | Geaghan et al. |
| 7,372,455 B2 | 5/2008 | Perski et al. |
| 7,382,139 B2 | 6/2008 | Mackey |
| 7,511,702 B2 | 3/2009 | Hotelling |
| 7,532,205 B2 | 5/2009 | Gillespie et al. |
| 7,567,240 B2 | 7/2009 | Peterson et al. |
| 7,570,064 B2 | 8/2009 | Roziere |
| 7,639,238 B2 | 12/2009 | Hauck |
| 7,663,607 B2 | 2/2010 | Hotelling et al. |
| 7,692,729 B2 | 4/2010 | Pak et al. |
| 7,808,255 B2 | 10/2010 | Hristov et al. |
| 7,812,827 B2 | 10/2010 | Hotelling et al. |
| 7,812,828 B2 | 10/2010 | Westerman et al. |
| 7,821,502 B2 | 10/2010 | Hristov |
| 7,825,885 B2 | 11/2010 | Sato et al. |
| 7,825,905 B2 | 11/2010 | Philipp |
| 7,898,122 B2 | 3/2011 | Andrieux et al. |
| 7,920,129 B2 | 4/2011 | Hotelling et al. |
| 7,932,898 B2 | 4/2011 | Philipp et al. |
| 7,948,477 B2 | 5/2011 | Hotelling |
| 8,149,002 B2 | 4/2012 | Ossart et al. |
| 8,159,213 B2 | 4/2012 | Roziere |
| 8,264,428 B2 | 9/2012 | Nam |
| 8,355,887 B1 | 1/2013 | Harding et al. |
| 8,390,582 B2 | 3/2013 | Hotelling et al. |
| 8,479,122 B2 | 7/2013 | Hotelling et al. |
| 8,576,161 B2 | 11/2013 | Chang et al. |
| 8,654,083 B2 | 2/2014 | Hotelling et al. |
| 8,665,237 B2 | 3/2014 | Koshiyama et al. |
| 8,766,950 B1 | 7/2014 | Morein et al. |
| 8,770,033 B2 | 7/2014 | Roziere |
| 8,773,351 B2 | 7/2014 | Rekimoto |
| 8,884,890 B2 | 11/2014 | Hotelling et al. |
| 8,890,850 B2 | 11/2014 | Chung et al. |
| 8,917,256 B2 | 12/2014 | Roziere |
| 9,000,782 B2 | 4/2015 | Roziere |
| 9,035,903 B2 | 5/2015 | Binstead |
| 9,075,491 B2 | 7/2015 | Hotelling et al. |
| 9,117,679 B2 | 8/2015 | Ma |
| 9,151,791 B2 | 10/2015 | Roziere |
| 9,250,757 B2 | 2/2016 | Roziere |
| 9,268,427 B2 | 2/2016 | Yousefpor et al. |
| 9,336,723 B2 | 5/2016 | Gupta et al. |
| 9,423,897 B2 | 8/2016 | Bae |
| 9,442,330 B2 | 9/2016 | Huo |
| 9,448,675 B2 | 9/2016 | Morein et al. |
| 9,465,502 B2 | 10/2016 | Hotelling et al. |
| 9,535,547 B2 | 1/2017 | Roziere |
| 9,836,160 B2 | 12/2017 | Hotelling et al. |
| 10,007,388 B2 | 6/2018 | Roziere |
| 10,019,103 B2 | 7/2018 | Gupta et al. |
| 10,133,382 B2 | 11/2018 | Yang et al. |
| 10,146,359 B2 | 12/2018 | Tang |
| 10,175,832 B2 | 1/2019 | Roziere |
| 10,209,813 B2 | 2/2019 | Yao |
| 2002/0015024 A1 | 2/2002 | Westerman et al. |
| 2003/0075427 A1 | 4/2003 | Caldwell |
| 2003/0231168 A1 | 12/2003 | Bell et al. |
| 2004/0135773 A1 | 7/2004 | Bang et al. |
| 2004/0243747 A1 | 12/2004 | Rekimoto |
| 2005/0219228 A1 | 10/2005 | Alameh et al. |
| 2005/0270273 A1 | 12/2005 | Marten |
| 2006/0001640 A1 | 1/2006 | Lee |
| 2006/0022956 A1 | 2/2006 | Lengeling et al. |
| 2006/0084852 A1 | 4/2006 | Mason et al. |
| 2006/0092142 A1 | 5/2006 | Gillespie et al. |
| 2006/0097733 A1 | 5/2006 | Roziere |
| 2006/0161871 A1 | 7/2006 | Hotelling et al. |
| 2006/0187214 A1 | 8/2006 | Gillespie et al. |
| 2006/0197753 A1 | 9/2006 | Hotelling |
| 2006/0207806 A1 | 9/2006 | Philipp |
| 2006/0227114 A1 | 10/2006 | Geaghan et al. |
| 2006/0274055 A1 | 12/2006 | Reynolds et al. |
| 2007/0034423 A1 | 2/2007 | Rebeschi et al. |
| 2007/0062739 A1 | 3/2007 | Philipp et al. |
| 2007/0074913 A1 | 4/2007 | Geaghan et al. |
| 2007/0273560 A1 | 11/2007 | Hua et al. |
| 2007/0279395 A1 | 12/2007 | Philipp |
| 2008/0006454 A1 | 1/2008 | Hotelling |
| 2008/0012835 A1 | 1/2008 | Rimon et al. |
| 2008/0042985 A1 | 2/2008 | Katsuhito et al. |
| 2008/0062148 A1 | 3/2008 | Hotelling et al. |
| 2008/0074401 A1 | 3/2008 | Chung et al. |
| 2008/0088595 A1 | 4/2008 | Liu et al. |

(56) References Cited

U.S. PATENT DOCUMENTS

| | | |
|---|---|---|
| 2008/0100572 A1 | 5/2008 | Boillot |
| 2008/0143683 A1 | 6/2008 | Hotelling |
| 2008/0158167 A1 | 7/2008 | Hotelling et al. |
| 2008/0158182 A1 | 7/2008 | Westerman |
| 2008/0158198 A1 | 7/2008 | Elias |
| 2008/0174321 A1 | 7/2008 | Kang et al. |
| 2008/0180365 A1 | 7/2008 | Ozaki |
| 2008/0231603 A1 | 9/2008 | Parkinson et al. |
| 2008/0246496 A1 | 10/2008 | Hristov et al. |
| 2008/0284261 A1 | 11/2008 | Andrieux et al. |
| 2008/0303770 A1 | 12/2008 | Oke et al. |
| 2008/0303964 A1 | 12/2008 | Lee et al. |
| 2009/0009485 A1 | 1/2009 | Bytheway |
| 2009/0091546 A1 | 4/2009 | Joo et al. |
| 2009/0109192 A1* | 4/2009 | Liu .................... G06F 3/0416 345/174 |
| 2009/0141046 A1 | 6/2009 | Rathnam et al. |
| 2009/0174686 A1 | 7/2009 | Jeon et al. |
| 2009/0179868 A1 | 7/2009 | Ayres et al. |
| 2009/0212642 A1 | 8/2009 | Krah |
| 2009/0238012 A1 | 9/2009 | Tatapudi et al. |
| 2009/0251427 A1 | 10/2009 | Hung et al. |
| 2009/0309851 A1 | 12/2009 | Bernstein |
| 2009/0322730 A1 | 12/2009 | Yamamoto et al. |
| 2010/0004029 A1 | 1/2010 | Kim |
| 2010/0007616 A1 | 1/2010 | Jang |
| 2010/0013745 A1 | 1/2010 | Kim et al. |
| 2010/0019779 A1 | 1/2010 | Kato et al. |
| 2010/0031174 A1 | 2/2010 | Kim |
| 2010/0052700 A1 | 3/2010 | Yano et al. |
| 2010/0090964 A1 | 4/2010 | Soo et al. |
| 2010/0097346 A1 | 4/2010 | Sleeman |
| 2010/0123667 A1 | 5/2010 | Kim et al. |
| 2010/0139991 A1 | 6/2010 | Philipp et al. |
| 2010/0149127 A1 | 6/2010 | Fisher et al. |
| 2010/0182018 A1 | 7/2010 | Hazelden |
| 2010/0201635 A1 | 8/2010 | Klinghult et al. |
| 2010/0253638 A1 | 10/2010 | Yousefpor et al. |
| 2010/0265187 A1 | 10/2010 | Chang et al. |
| 2010/0265188 A1 | 10/2010 | Chang et al. |
| 2010/0277418 A1* | 11/2010 | Huang ................ G06F 3/045 345/173 |
| 2010/0321305 A1 | 12/2010 | Chang et al. |
| 2010/0328262 A1 | 12/2010 | Huang et al. |
| 2011/0001491 A1 | 1/2011 | Huang et al. |
| 2011/0006999 A1 | 1/2011 | Chang et al. |
| 2011/0007021 A1 | 1/2011 | Bernstein et al. |
| 2011/0007030 A1 | 1/2011 | Mo et al. |
| 2011/0061949 A1 | 3/2011 | Krah et al. |
| 2011/0080391 A1 | 4/2011 | Brown et al. |
| 2011/0169783 A1 | 7/2011 | Wang et al. |
| 2011/0242027 A1 | 10/2011 | Chang |
| 2011/0298727 A1 | 12/2011 | Yousefpor et al. |
| 2012/0044662 A1 | 2/2012 | Kim et al. |
| 2012/0182251 A1 | 7/2012 | Krah |
| 2012/0187965 A1 | 7/2012 | Roziere |
| 2012/0188200 A1 | 7/2012 | Roziere |
| 2012/0235949 A1 | 9/2012 | Ligtenberg |
| 2012/0242597 A1 | 9/2012 | Hwang et al. |
| 2012/0262410 A1* | 10/2012 | Lim .................... G06F 3/0416 345/174 |
| 2012/0274603 A1 | 11/2012 | Kim et al. |
| 2012/0287068 A1* | 11/2012 | Colgate ................ G06F 3/016 345/173 |
| 2013/0076647 A1 | 3/2013 | Yousefpor et al. |
| 2013/0076648 A1 | 3/2013 | Krah et al. |
| 2013/0106755 A1 | 5/2013 | Hotelling et al. |
| 2013/0135247 A1 | 5/2013 | Na et al. |
| 2013/0141343 A1 | 6/2013 | Yu et al. |
| 2013/0170116 A1 | 7/2013 | In et al. |
| 2013/0181943 A1 | 7/2013 | Bulea et al. |
| 2013/0194231 A1 | 8/2013 | Smith et al. |
| 2013/0285971 A1 | 10/2013 | Eltas et al. |
| 2013/0293499 A1 | 11/2013 | Chang et al. |
| 2013/0307776 A1 | 11/2013 | Roziere |
| 2013/0314393 A1 | 11/2013 | Min et al. |
| 2013/0328795 A1 | 12/2013 | Yao et al. |
| 2013/0328800 A1 | 12/2013 | Pu et al. |
| 2013/0342431 A1 | 12/2013 | Saeedi et al. |
| 2013/0342479 A1 | 12/2013 | Pyo et al. |
| 2014/0028535 A1 | 1/2014 | Min et al. |
| 2014/0043546 A1 | 2/2014 | Yamazaki et al. |
| 2014/0070823 A1 | 3/2014 | Roziere |
| 2014/0078096 A1 | 3/2014 | Tan et al. |
| 2014/0078097 A1 | 3/2014 | Shepelev et al. |
| 2014/0111496 A1 | 4/2014 | Gomez et al. |
| 2014/0132335 A1 | 5/2014 | Rauhala et al. |
| 2014/0132534 A1 | 5/2014 | Kim |
| 2014/0132560 A1 | 5/2014 | Huang et al. |
| 2014/0267070 A1 | 9/2014 | Shahparnia et al. |
| 2014/0267165 A1 | 9/2014 | Roziere |
| 2014/0327654 A1 | 11/2014 | Sugita et al. |
| 2015/0035787 A1 | 2/2015 | Shahparnia et al. |
| 2015/0035792 A1 | 2/2015 | Roziere et al. |
| 2015/0084911 A1 | 3/2015 | Stronks et al. |
| 2015/0116243 A1 | 4/2015 | Saitou et al. |
| 2015/0194470 A1 | 7/2015 | Hwang |
| 2015/0277648 A1 | 10/2015 | Small |
| 2016/0034102 A1 | 2/2016 | Roziere et al. |
| 2016/0117017 A1 | 4/2016 | Kremin et al. |
| 2016/0170533 A1 | 6/2016 | Roziere |
| 2016/0211808 A1 | 7/2016 | Lee et al. |
| 2016/0224177 A1 | 8/2016 | Krah |
| 2016/0253034 A1 | 9/2016 | Gupta et al. |
| 2016/0320898 A1 | 11/2016 | Tang |
| 2017/0003817 A1 | 1/2017 | Hotelling et al. |
| 2017/0090644 A1 | 3/2017 | Yao |
| 2017/0108968 A1 | 4/2017 | Roziere |
| 2017/0139539 A1 | 5/2017 | Yao et al. |
| 2017/0168619 A1 | 6/2017 | Yang et al. |
| 2017/0262121 A1 | 9/2017 | Kurasawa |
| 2017/0315646 A1 | 11/2017 | Roziere |
| 2017/0351378 A1 | 12/2017 | Wang et al. |
| 2018/0074633 A1 | 3/2018 | Kida |
| 2018/0101275 A1 | 4/2018 | Hotelling et al. |
| 2018/0107309 A1 | 4/2018 | Endo et al. |
| 2018/0314385 A1 | 11/2018 | Gupta |

FOREIGN PATENT DOCUMENTS

| | | |
|---|---|---|
| CN | 10-2483659 A | 5/2012 |
| CN | 102 760 405 A | 10/2012 |
| CN | 10-2881839 A | 1/2013 |
| DE | 11-2012 004912 T5 | 8/2014 |
| EP | 2 144 146 A1 | 1/2010 |
| EP | 2 224 277 A1 | 9/2010 |
| EP | 2 267 791 A2 | 10/2010 |
| EP | 2 256 606 A2 | 12/2010 |
| FR | 2 756 048 A1 | 5/1998 |
| FR | 2756048 A1 | 5/1998 |
| FR | 2 896 595 A1 | 7/2007 |
| FR | 2 949 008 | 2/2011 |
| FR | 3 004 551 A1 | 10/2014 |
| JP | H10-505183 A | 5/1998 |
| JP | 2000-163031 A | 6/2000 |
| JP | 2002-342033 A | 11/2002 |
| JP | 2004-526265 A | 8/2004 |
| JP | 2006-251927 A | 9/2006 |
| JP | 2008-117371 A | 5/2008 |
| JP | 2009-086240 A | 4/2009 |
| JP | 2009-157373 A | 7/2009 |
| JP | 2011-141464 A | 7/2011 |
| JP | 2013-109095 A | 6/2013 |
| KR | 10-2008-0041278 A | 5/2008 |
| KR | 10-2008-0060127 A | 7/2008 |
| KR | 10-2010-0054899 A | 5/2010 |
| KR | 10-2011-0044670 A | 4/2011 |
| TW | 200508580 A | 3/2005 |
| TW | 201126236 A | 8/2011 |
| WO | WO-00/44018 A1 | 7/2000 |
| WO | WO-2005/073834 A2 | 8/2005 |
| WO | WO-2005/114369 A2 | 12/2005 |
| WO | WO-2005/114369 A3 | 12/2005 |
| WO | WO-2007/003108 A1 | 1/2007 |

(56) References Cited

FOREIGN PATENT DOCUMENTS

| WO | WO-2007/146780 A2 | 12/2007 |
| WO | WO-2008/000964 A1 | 1/2008 |
| WO | WO-2008/030780 A1 | 3/2008 |
| WO | WO-2011/015795 A3 | 2/2011 |
| WO | WO-2013/093327 A1 | 6/2013 |
| WO | WO-2015/088629 A1 | 6/2015 |
| WO | WO-2015/175013 A1 | 11/2015 |
| WO | WO-2015/178920 | 11/2015 |
| WO | WO-2016/066282 A1 | 5/2016 |
| WO | WO-2016/126525 A1 | 8/2016 |

OTHER PUBLICATIONS

French Search Report, dated Mar. 12, 2012, from corresponding FR application.

International Search Report, dated Nov. 27, 2012, from corresponding PCT application.

International Search Report dated Apr. 16, 2013, corresponding to PCT/FR2012/052974, two pages.

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

Non-Final Office Action dated Mar. 17, 2014, for U.S. Appl. No. 13/388,611, filed Apr. 10, 2012, sixteen pages.

Non-Final Office Action dated May 1, 2014, for U.S. Appl. No. 13/388,627, filed Apr. 10, 2012, eight pages.

Non-Final Office Action dated Sep. 16, 2014, for U.S. Appl. No. 14/354,334, filed Apr. 25, 2014, 24 pages.

Non-Final Office Action dated Nov. 2, 2015, for U.S. Appl. No. 14/341,230, filed Jul. 25, 2014, nine pages.

Non-Final Office Action dated Mar. 10, 2016, for U.S. Appl. No. 14/126,163, filed Dec. 13, 2013, four pages.

Notice of Allowance dated Nov. 28, 2014, for U.S. Appl. No. 13/388,627, filed Apr. 10, 2012, seven pages.

Notice of Allowance dated Jun. 10, 2015, for U.S. Appl. No. 14/082,678, filed Nov. 18, 2013, seven pages.

Notice of Allowance dated Sep. 25, 2015, for U.S. Appl. No. 14/354,334, filed Apr. 25, 2014, seven pages.

Notice of Allowance dated May 9, 2016, for U.S. Appl. No. 14/341,230, filed Jul. 25, 2014, five pages.

Notice of Allowance dated Aug. 8, 2016, for U.S. Appl. No. 14/126,163, filed Dec. 13, 2013, seven pages.

Notice of Allowance dated Jan. 13, 2017, for U.S. Appl. No. 14/126,163, filed Dec. 13, 2013, seven pages.

Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.

Rubine, D.H. (May 1992). "Combining Gestures and Direct Manipulation," CHI ' 92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

Chinese Search Report dated Mar. 2, 2018, for CN Application No. 201510863213.1, with English translation, four pages.

Final Office Action dated Mar. 29, 2018, for U.S. Appl. No. 15/008,369, filed Jan. 27, 2016, 11 pages.

Notice of Allowance dated Mar. 14, 2018, for U.S. Appl. No. 15/396,213, filed Dec. 30, 2016, nine pages.

Chinese Search Report dated Apr. 6, 2017, for CN Application No. 201280063934.9, with English translation, four pages.

International Search Report dated Oct. 21, 2015, for PCT Application No. PCT/EP2015/063857, six pages.

Yang, J-H. et al. (Jul. 2013). "A Noise-Immune High-Speed Read-out Circuit for In-Cell Touch Screen Panels," *IEEE Transactions on Circuits and Systems—1: Regular Papers* 60(7):1800-1809.

Non-Final Office Action dated Sep. 11, 2017, for U.S. Appl. No. 15/008,369, filed Jan. 27, 2016, 12 pages.

Notice of Allowance dated Sep. 13, 2018, for U.S. Appl. No. 15/008,369, filed Jan. 27, 2016, seven pages.

Boie, R.A. (Mar. 1984). "Capacitive Impedance Readout Tactile Image Sensor," *Proceedings of 1984 IEEE International Conference on Robotics and Automation*, pp. 370-378.

Chun, K. et al. (Jul. 1985). "A High-Performance Silicon Tactile Imager Based on a Capacitive Cell," *IEEE Transactions on Electron Devices* 32(7):1196-1201.

Kamba, T. et al. (1996). "Using Small Screen Space More Efficiently," *Proceedings of the SIGCHI Conference on Human Factors in Computing Systems*, Apr. 13-18, 1996, pp. 383-390.

Krein, P. et al. (May/Jun. 1990). "The Electroquasistatics of the Capacitive Touch Panel," *IEEE Transactions on Industry Applications* 26(3):529-534.

Leeper, A.K. (May 21, 2002). "14.2: Integration of a Clear Capacitive Touch Screen with a 1/8-VGA FSTN-LCD to Form and LCD-Based TouchPad," *SID 02 Digest*, pp. 187-189.

Quantum Research Group. (2006). "Design Winds," 25 pages.

Quantum Research Group. (2006). "Qmatrix Technology White Paper," four pages.

Sarma, K. (2004). "Liquid Crystal Displays," Electrical Measurement, Chapter 32 *In Signal Processing and Displays*, CRC Press LLC. pp. 32.1-32.21.

Suzuki, K. et al. (Aug. 1990). "A 1024-Element High-Performance Silicon Tactile Imager," *IEEE Transactions on Electron Devices* 37(8):1852-1860.

Synaptics. (2005). "Transparent Capacitive Position Sensing", located at http://www.synaptics.com/technology/tcps.cfm, last visited Sep. 16, 2011, two pages.

\* cited by examiner

DEVICE AND METHOD FOR GENERATING AN ELECTRICAL POWER SUPPLY IN AN ELECTRONIC SYSTEM WITH A VARIABLE REFERENCE POTENTIAL

CROSS REFERENCE TO RELATED APPLICATIONS

The present application is a continuation of U.S. patent application Ser. No. 14/126,163, filed Dec. 13, 2013 and published on Apr. 17, 2014 as U.S. Patent Publication No. 2014-0103712, which is a National Phase application under 35 U.S.C. § 371 of International Application No. PCT/FR2012/051288, filed Jun. 8, 2012, which claims the priority benefit of French Patent Application No. 1155285, filed on Jun. 16, 2011, the contents of which are hereby incorporated by reference in their entireties for all intended purposes.

TECHNICAL FIELD

The present invention relates to a device for generating an electrical power supply in an electronic system with a variable reference potential.

The field of the invention is more particularly but non-limitatively that of electronic power supply devices.

STATE OF THE PRIOR ART

Generally, electronic systems are referenced with respect to a ground potential, which can be for example a voltage reference with respect to which the power supply voltages are fixed. This ground may or may not be connected to the earth.

In certain cases, it is necessary that electronic parts or sub-systems be referenced to potentials different from the ground potential of the overall system, and floating or variable with respect to the latter. This case is encountered for example in measurement systems, in order to be free from electrical interference noise sources.

Sometimes, the floating part is not totally separated from the remainder of the system by galvanic isolation, but it is floating or variable only in a range of frequencies, or about a working frequency.

Special arrangements are necessary in order to be able to electrically supply a floating sub-system and to transmit analogue and/or digital signals between this floating system and the part referenced to the ground potential.

This case is encountered for example in the document FR 2 756 048 by Roziere which discloses a capacitive measurement system. The detection circuit comprises a part that floats in a range of frequencies and of which the reference potential oscillates with respect to the ground of the overall system at an oscillation frequency.

The power supply voltages are transmitted to the floating part via inductance coils or choke coils placed in series on the lines so as to present a high impedance at the oscillation frequency of the floating reference potential.

The same principle can be used for transmitting digital or analogue signals.

These digital or analogue signals can also be transmitted between the floating and non-floating parts by other known means such as differential amplifiers, optical couplers, or radio transmission means.

Electronic functions must often be produced in the form of integrated electronic circuits with minimal overall dimensions and electrical consumption. This is particularly true for the capacitive measurement systems which are increasingly used to produce touch-sensitive interfaces for portable systems (telephones, computers, etc).

In this context, the known means for transmitting signals and the power supplies between the floating and non-floating parts have undesirable drawbacks, such as large overall dimensions and high consumption.

These drawbacks are particularly important with regard to the electrical power supply of the parts that are floating parts or subjected to variable reference potentials. In fact, power supply sources are more easily available for the non-floating parts and it is necessary to transfer signals, that are substantially DC and of sufficient power, between the systems having different reference potentials. This involves the use of inductances (choke coils) or of DC/DC converters that are particularly disadvantageous for producing integrated circuits.

The purpose of the present invention is to propose a device and a method for generating an electrical power supply with a variable reference potential from a power source having another reference potential, without necessitating the use of disadvantageous electrical isolation components.

DISCLOSURE OF THE INVENTION

This objective is achieved with a device for generating a power supply voltage referenced to a first reference potential, in an electronic system comprising an excitation source connected to said first and second reference potentials so as to impose an AC voltage difference between these reference potentials, characterized in that it comprises moreover:
  a source supplying an AC voltage referenced to said second reference potential, connected to said first reference potential, and encompassing said excitation source, and
  rectifying and filtering means connected at the input thereof to said first reference potential and to said AC voltage supply source respectively, so as to generate, at an output, a supply voltage referenced to said first reference potential by rectification of a voltage at the terminals of the AC voltage supply source.

The term "connected" must of course be interpreted in the sense that components connected to each other can be connected directly, through a direct electrical link, or connected via additional electrical or electronic components.

According to embodiments, the device according to the invention can comprise moreover:
  an excitation source referenced to the second reference potential;
  an excitation source comprising a buffer referenced to the second reference potential, connected at its output to the first reference potential, and controlled at its input by an oscillator referenced to said first reference potential;
  rectifying and filtering means connected at their input to the terminals of the excitation source or, if appropriate, to the buffer of the excitation source;
  rectifying and filtering means connected at their input to the second reference potential, so as to generate at an output a supply voltage referenced to the first reference potential by rectification of the voltage at the terminals of an excitation source referenced to the second reference potential.

The device according to the invention can comprise moreover an AC voltage supply source comprising at least one second AC voltage supply source connected to the second reference potential, and rectifying and filtering means connected at the input to said second AC voltage supply source.

It can then comprise moreover an excitation source referenced to the first reference potential.

Thus, according to the embodiments, the excitation source can be referenced to the first reference potential. In this case, the AC voltage supply source according to the invention comprises at least one second AC voltage source referenced to the second reference potential, which supplies the major part of the power. The excitation source is then used as a return path for the current of this second AC voltage source.

The excitation source can also be referenced to the second reference potential. In this case, it can be used as the sole voltage source for the AC voltage supply source according to the invention. It can also be used in conjunction with a second AC voltage source connected to the second reference potential, in an active configuration in which its voltage contributes to the AC voltage supply source, or in a passive configuration (for example if the frequencies of the sources are very different) in which case it is used as a return path for the current of this second AC voltage source.

Finally, the excitation source can comprise a buffer referenced to the second reference potential, connected at its output to the first reference potential, and controlled at its input by an oscillator referenced to the first reference potential. This buffer can for example be produced by means of operational amplifiers. The buffer supplies the power necessary for the excitation of the first reference potential with respect to the second one, in accordance with the signal supplied by the oscillator. In fact it behaves as an excitation source referenced to the second reference potential.

In all cases, the excitation source is encompassed (or comprised or included) in the AC voltage supply source according to the invention because its presence is an element necessary for its correct operation.

In fact, these configurations are possible because the excitation source behaves substantially as a perfect voltage generator, also called a Thevenin generator. It makes it possible to impose an AC voltage difference between the first and second reference potentials, whilst presenting a very low impedance to the supply current. This result could not be obtained without the presence of the excitation source.

When the excitation source comprises a buffer referenced to the second reference potential connected at its output to the first reference potential, it is this buffer which behaves at its output like a Thevenin generator placed between the first reference potential and, via the supply of the buffer, the second reference potential.

According to embodiments, the rectifying and filtering means can comprise:
  switching means;
  at least one diode inserted between the AC voltage supply source and the output of the supply voltage;
  a diode having a low threshold;
  a Schottky diode, a germanium diode, etc.;
  a filtering capacitor connected on the one hand to the first reference potential and on the other hand to the output of the supply voltage.

The device according to the invention can be produced using integrated electronics technologies.

According to another aspect, there is proposed an electronic capacitive measurement system comprising a first sub-system electrically referenced to a guard potential, a second sub-system electrically referenced to a ground potential, and an excitation source having terminals respectively connected to said guard and ground potentials so as to impose an AC voltage difference between these ground and guard potentials, this electronic capacitive measurement system comprising moreover a device according to the invention for generating a supply voltage referenced to said guard potential.

The electronic capacitive measurement system can comprise moreover a charge amplifier referenced to the guard potential and supplied by a device according to the invention for generating a supply voltage referenced to said guard potential.

According to yet another aspect, there is proposed a method for generating a supply voltage reference to a first reference potential in an electronic system comprising an excitation source connected to said first and second reference potentials so as to impose an AC voltage difference between these reference potentials, This method comprising moreover the steps:
  of generation of an AC supply voltage by means of an AC voltage supply source referenced to said second reference potential, connected to said first reference potential, and encompassing said excitation source, and
  of rectification of a voltage at the terminals of said AC voltage supply source, with rectifying and filtering means connected at their input to respectively to said first reference potential and to said AC voltage supply source, so as to generate at an output of said rectifying and filtering means a supply voltage referenced to said first reference potential.

DESCRIPTION OF THE FIGURES AND EMBODIMENTS

Figure 2:
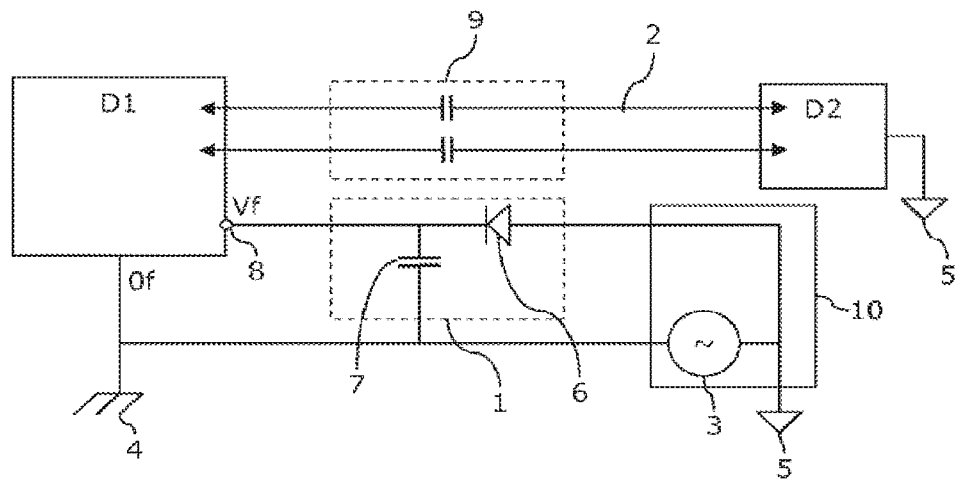
Figure 3:
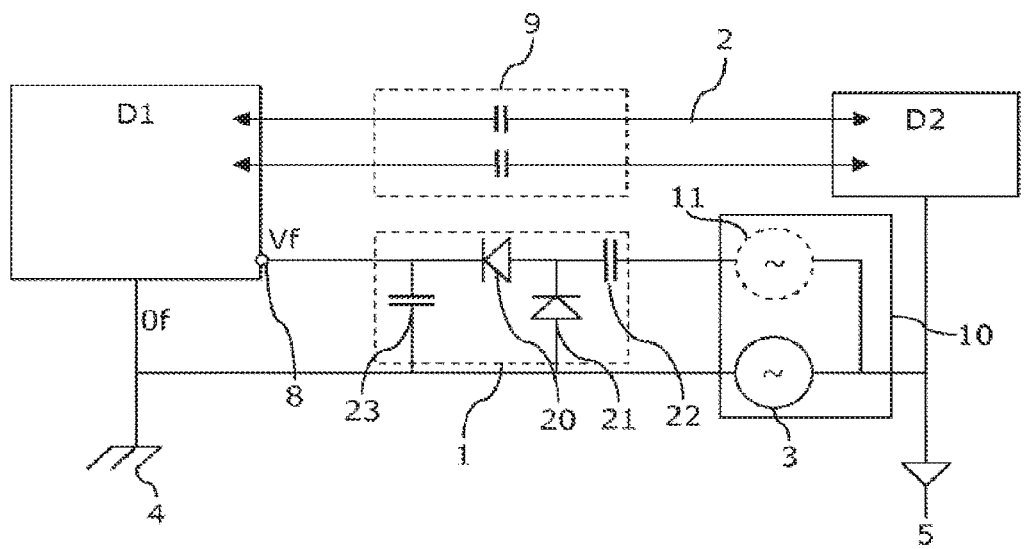
Figure 4:
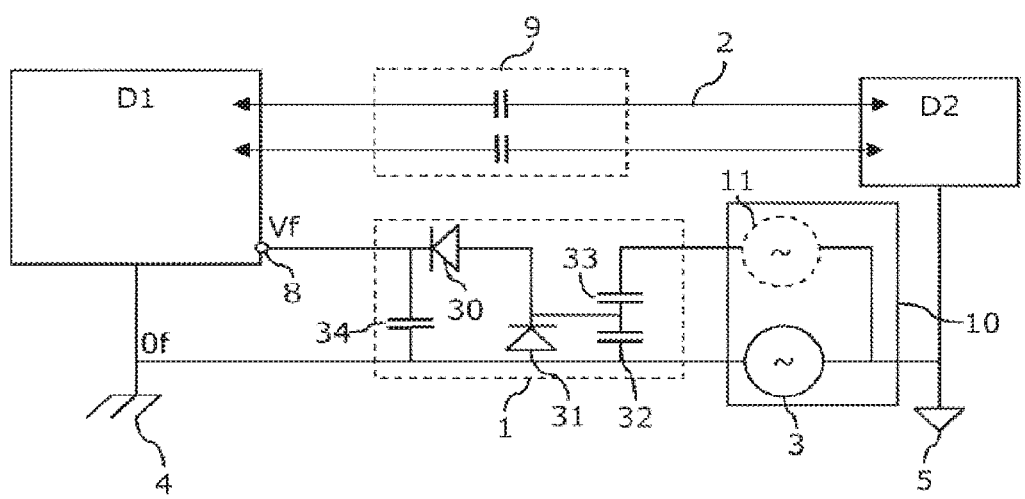
Figure 5:
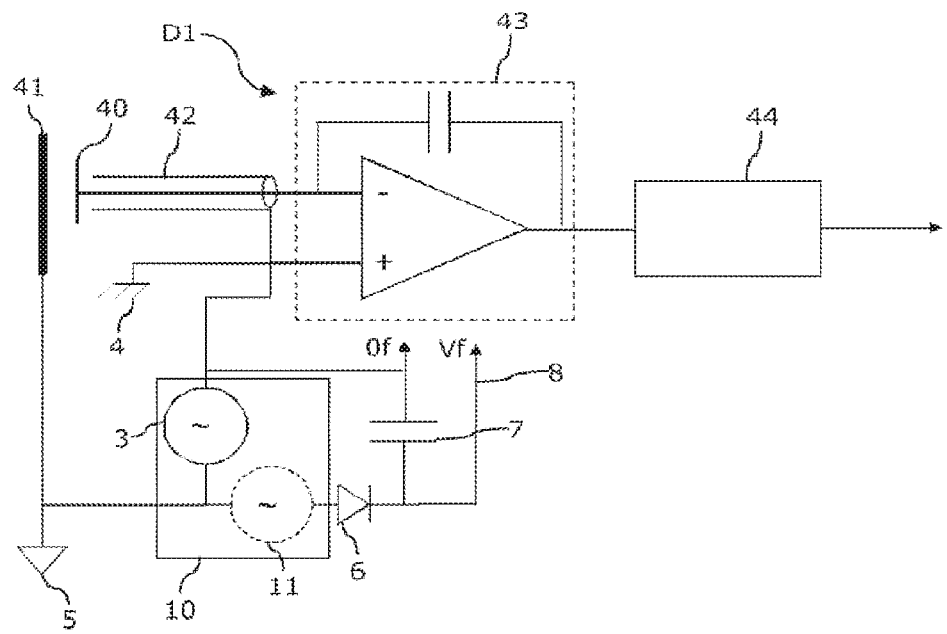
Figure 6:
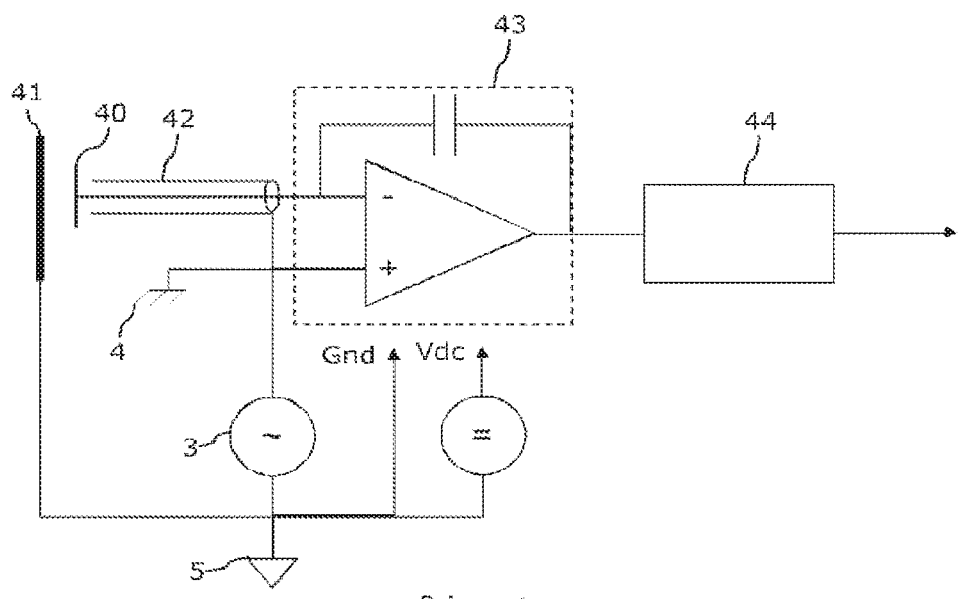

Other advantages and characteristics of the invention will become apparent on examination of the detailed description of an embodiment which is in no way limitative, and the attached diagrams, in which:

FIG. 1 shows an embodiment of a device for generating supply voltage a according to the invention between electronic systems of which the reference potentials are connected by a periodic signal comprising a first embodiment of rectifying and filtering means and an AC voltage supply source comprising an excitation source and a second AC voltage source, FIG. 2 shows an embodiment of a device for generating supply voltage according to the invention comprising a first embodiment of rectifying and filtering means and an AC voltage supply source comprising an excitation 25 source, FIG. 3 shows an embodiment of a device for generating supply voltage according to the invention comprising a second embodiment of rectifying and filtering means, FIG. 4 shows an embodiment of a device for generating supply 30 voltage according to the invention comprising a third embodiment of rectifying and filtering means, FIG. 5 shows an embodiment of an electronic capacitive measurement system implementing a device for generating supply voltage according to the invention, and FIG. 6 shows an embodiment example of an electronic capacitive measurement system of the prior art.

With reference to FIG. 1, the purpose of the present invention is to allow the generation of an electrical power supply Vf with a variable reference potential Of from a power source having another reference potential.

In particular, the invention makes it possible to avoid the use of electrical isolation components that are disadvantageous in terms of integration in integrated electronic circuits such as ASICs (Application Specific Integrated Circuits).

It is applied in electronic applications necessitating the interconnection of electronic systems D1, D2 of which the reference potentials 4, 5 are connected by a periodic AC signal generated by an excitation source 3. This AC signal can be of any form, for example sinusoidal, square or triangular.

This situation occurs, for example, in electronic measurement systems.

According to a frequent but non-limitative configuration, the electronic system comprises:
- a system D2 electrically referenced to the ground or to the earth 5, which comprises the electrical power supply means of the assembly, or is connected to an electrical power supply network;
- another electronic system D1 electrically referenced to a variable reference potential 4, which comprises for example electronic measuring means or high-sensitivity and/or low noise detection means;
- an AC voltage excitation source 3 which connects (directly or indirectly) the ground 5 and the variable reference 4, in such a way as to make the variable reference voltage 4 oscillate with respect to the ground 5.

The electronic systems D1 and D2 are connected by electrical connections 2 which make it possible to convey, for example, digital or analogue signals. These electrical connections 2 are provided with decoupling means 9 in order to provide electrical isolation between the reference potentials 4 and 5, at least in a range of frequencies. These decoupling means 9 can for example comprise inductances inserted in series on the lines or differential operational amplifiers. They can also comprise capacitors, which constitute an advantageous solution in terms of integration in a context of the production of circuits in the form of integrated circuits.

It is also known to use DC/DC converters but these are also disadvantageous in terms of overall dimensions in integrated circuits.

For the purpose of generating the variable potential 4, the excitation source 3 can be referenced either to this variable reference potential 4 or to the ground potential 5. It is then supplied, respectively, by a supply referenced to the variable reference potential 4 or to the ground potential 5.

However, as the electrical power supply sources are generally more easily available in one of the systems D1 or D2, it is preferable to use an excitation source 3 referenced to the corresponding reference potential 4 or 5. Thus, it is often preferable for the excitation source 3 to be referenced to the ground potential 5. It can then be supplied by a supply referenced to this same ground potential 5, which is more easily available and capable of providing an adequate electrical power.

According to an advantageous aspect of the invention, the excitation source 3 is used for producing an AC voltage supply source 10, capable of generating one or more power supply voltage(s) Vf referenced to the variable potential 4.

According to the embodiment shown in FIG. 1, the AC voltage supply source 10 comprises therefore the excitation source 3 and at least one second AC voltage source 11. The second AC voltage source 11 is connected to the ground potential 5. It is therefore connected, via the ground 5 or directly, to the excitation source 3. The device according to the invention also comprises rectifying and filtering means 1 which are connected at the input to the terminals of the AC supply source 10, and therefore inserted around the excitation source 3, between the electronic systems D1 and D2.

From the point of view of the rectifying and filtering means, the AC supply source 10 comprises therefore, in series, the excitation source 3 and the second AC voltage source 11.

The function of the excitation source 3 is to allow a return of the supply circuit through a connection between the variable reference potential 4 and the ground potential 5, without short-circuiting these reference potentials at the frequencies of the excitation signal of the excitation source 3. This effect is obtained as explained previously thanks to the Thevenin generator operation of the excitation source 3, which imposes the excitation signal between the variable 4 and ground 5 reference potentials, whilst having a low impedance.

Depending on the configurations, the excitation source 3 can contribute to a greater or lesser degree to the generation of the voltage of the AC power supply source 10. Basically, its contribution is that of a voltage source placed in series with the second AC voltage source 11. For example:
- if the signals of the excitation source 3 and of the second AC voltage source 11 are at close frequencies, their contributions to the voltage of the AC power supply source 10 combine;
- if the signals of the excitation source 3 and of the second AC voltage source 11 are at very different frequencies, the signals of the excitation source 3 can be rejected by filtering components (capacitors for example) in the rectifying and filtering means. This configuration makes it possible to generate power supply voltages Vf referenced to the variable reference potential 4 independent of the characteristics of the signals of the excitation source 3, whilst making use of the properties of the link that it provides between the ground 5 and variable reference 4 potentials. Thus, it is possible for example to modulate the amplitude of the excitation source 3 without modifying the supply voltage Vf which depends only on the second AC voltage source 11.

The function of the rectifying and filtering means 1 is:
- to rectify the signal of the AC power supply source 10, i.e. to generate a supply voltage Vf with a non-zero mean value, from the signal of the AC power supply source 10 which can have a zero or any mean value;
- to smooth the rectified signal in order to reduce the amplitude of the voltage fluctuations.

According to an embodiment example shown in FIG. 1, they comprise:
- a voltage rectifier component 6, connected to a terminal of the AC power supply source 10. The output of this rectifier component provides the supply voltage Vf, which is referenced to the variable potential 4 and which is therefore usable for the system D1. According to the embodiment shown in FIG. 1, this component is a diode 6, for example one with a low threshold of the Schottky type. The orientation of this diode 6 is in general immaterial, in particular if the AC power supply source 10 supplies a symmetrical signal. In fact, depending on its direction, it blocks the positive or negative alternations, respectively, of the signal of the AC power supply source 10, and thus determines the sign of the supply Vf;
- a filtering component 7 which can be limited to a capacitor 7 respectively connected to the output 8 of the diode 6, at the end opposite to that of the ground 5, and to the output of the AC power supply source 10 connected to the variable reference potential 4. The capacitor 7 smoothes the rectified signal coming from the diode 6.

With reference to FIG. 2, the AC power supply source 10 can be constituted by the excitation source 3, referenced to the ground potential 5.

The rectifying and filtering means 1 (identical in the example of FIG. 1 to those of FIG. 2) are then connected to the terminals of the excitation source 3.

In this way a device 1 is constituted rectifying the voltage of the excitation source 3 which is connected to the terminals of the latter according to an arrangement that is inverted with respect to the conventional circuit diagrams of the prior art (since the diode 6 is in fact connected at its output to the ground 5 of the excitation source 3). However, as the active output of the excitation source 3 is also connected to the variable potential 4, it follows that there is thus generated, with a minimum of components that can be integrated easily, a rectified supply voltage Vf referenced to the variable potential 4 and available for the system that has the variable reference potential D1.

Voltage raising or lowering rectifying and filtering means 1, making it possible to adjust the supply voltage to the technical constraints of circuits whilst minimizing losses, can also be used in the context of the invention.

FIG. 3 shows an embodiment example in which the rectifying and filtering means 1 comprise a voltage raising device, for example known as a Schenkel voltage-doubling rectifier.

This embodiment can be used with different embodiments of the AC power supply source 10, which can comprise the excitation source 3 and optionally one or more AC voltage sources 11.

The voltage raising device comprises the diodes 20, 21 and the capacitor 22, arranged as shown in FIG. 2. It makes it possible, from a symmetrical or at least bipolar AC voltage source 11, to supply at its output 8 a supply voltage Vf referenced to the variable potential 4 of which the amplitude is of the order of the peak-to-peak amplitude of the signal of the source 11. The diodes 20, 21 are preferably low-threshold Schottky diodes.

The rectifying and filtering means 1 also comprise a filtering component 23 which can be limited to a capacitor 23 connected, respectively, to the output 8 of the diode 20 and to the output of the excitation source 3 connected to the variable reference potential 4. The capacitor 7 smoothes the rectified signal coming from the voltage raising device.

FIG. 4 shows an embodiment example in which the rectifying and filtering means 1 comprise a high-output voltage divider device.

This embodiment can be used with different embodiments of the AC power supply source 10, which can comprise the excitation source 3 and optionally one or more AC voltage sources 11.

The voltage dividing device comprises the diodes 30, 31 and the capacitors 32, 33, arranged as shown in FIG. 3. It makes it possible, from a single-pole AC voltage source 10 (i.e. oscillating between a maximum or minimum value of voltage and the reference potential 5), to supply at its output 8 a supply voltage Vf referenced to the variable potential 4 of which the amplitude is for example of the order of half of the peak-to-peak amplitude of the signal of the source 10 if the capacitors 32, 33 have the same value. The diodes 30, 31 are preferably low-threshold Schottky diodes.

The rectifying and filtering means 1 also comprise a filtering component 34 which can be limited to a capacitor 34 connected, respectively, to the output 8 of the diode 30, and to the output of the excitation source 3 connected to the variable reference potential 4. The capacitor 34 smoothes the rectified signal coming from the voltage-raising device.

According to variants,

- an AC power supply source 10 can comprise a plurality of AC voltage sources 11;
- several supplies Vf can be produced from the same excitation source 3, and/or the same AC power supply source 10;
- any rectifying and filtering means 1 making it possible to generate one or more supply voltages Vf referenced to the variable potential 4 from an AC power supply source 10 can be used in the context of the invention. They can comprise, in a non-limitative way, charge transfer systems, charge pump systems, voltage raising or attenuating systems, switches, produced by the association of capacitors and diodes or by any other means;
- the rectifying and filtering means 1 can use any type of switching means capable of allowing a rectification of the signal of the AC power supply source 10. They can for example comprise passive switches such as diodes only allowing signals with a specified polarity to pass through, Schottky diodes for reducing losses, or active analogue switches, controlled for example by means of transistors;
- the smoothing function can be carried out by equivalent elements, such as parasitic capacitances and insofar as is necessary for the requirements for using the AC supply voltage Vf;
- the signals of the AC voltage source or sources 11 and/or of the excitation source 3 can be sinusoidal, square or of any other shape;
- the AC voltage source or sources 11 and/or the excitation source 3 can comprise a symmetrical bipolar oscillator supplying a signal comprised between a positive value and a negative value, or an asymmetrical single-pole oscillator supplying a signal comprised between a maximum or minimum value and the reference potential 5;
- the alternative AC voltage source or sources 11 and/or the excitation source 3 can be of analogue or digital type, for example a direct digital synthesis (DDS) type;

Devices according to the invention can advantageously be used in a large variety of electronic systems which necessitate grounds 4, 5 at different potentials but not necessarily isolated.

The device according to the invention is particularly well suited for producing the power supply for the floating part (or the part with a variable reference potential) of a floating bridge capacitive measuring system such as described for example in the document FR 2 756 048 by Roziere. In fact, in this application, the detection circuit comprises a so-called floating part of which the reference potential, referred to as the guard potential, oscillates with respect to the ground of the overall system, or to the ground. The AC potential difference between the guard potential and the ground is generated by an excitation source. In the embodiments described in FR 2 756 048, the supplies of the part referenced to the guard are produced, in particular through DC/DC converters and/or inductance coils, from the supplies of the part referenced to the ground. As explained previously, these components are very disadvantageous in terms of integration in integrated circuits.

FIG. 5 shows a configuration example of a floating bridge capacitive measuring system such as described in the document FR 2 756 048, in capacitance measurement mode, to which has been added a power supply device according to the invention. The embodiment shown is, by way of non-limitative example, that of FIG. 1 or of FIG. 2. In order to make the notations consistent, it is considered that the capacitive bridge referenced to the guard corresponds to the system D1 of FIG. 1 and the part referenced to the ground or to the earth corresponds to the system D2.

This capacitive measuring system makes it possible to measure an item of capacitance information between at least one measuring electrode 40 and a target 41 connected to a potential different from the guard potential 4, such as for example the ground potential 5.

It comprises a floating part D1 referenced to a guard potential 4 oscillating with respect to the ground potential 5. An excitation source 3 referenced to the ground potential 5 provides the energising of the guard potential 4. A guard electrode 42 protects the measuring electrode 40. As it is at the same potential as the latter, it prevents the appearance of parasitic capacitances. The measuring electrode 40 is connected to a charge amplifier 43 which makes it possible to measure its capacitance.

Depending on the applications, the floating part of the electronics D1 can comprise other steps of processing the signal 44, in order for example to supply a signal representative of a distance between the measuring electrode 40 and the target 41. The system can moreover comprise several electrodes 40 having any geometry. It can also comprise a scanner inserted between the electrodes 40 and the charge amplifier 43, and making it possible to measure the capacitance of electrodes 40 sequentially.

The floating electronic system D1 and in particular the charge amplifier 43 are supplied by a device according to the invention, comprising an AC voltage supply source 10 based on the excitation source 3. This supply device comprises a rectifying diode 6 and a filtering capacitor 7, which deliver a supply voltage Vf referenced to the guard potential 4.

This floating bridge circuit shown in FIG. 5 or such as described in FR 2 756 048 makes it possible to be free of all parasitic capacitances, but this effect is obtained only if the components of the floating electronic system D1 are really powered in floating mode, hence the importance of generating high-quality power supplies for the floating part D1. In fact, in this case, the measuring electrode 41, the guard electrode 42 and the reference Of of the power supply of the charge amplifier 43 are all approximately at the same floating AC potential, and practically no parasitic capacitance can appear between these elements.

FIG. 6 shows a capacitive measuring system with an active guard known in the prior art which also comprises a guard 4 energized by an excitation source 3. However, in this case the charge amplifier is supplied by a voltage source Vdc referenced to the ground 5. This circuit has the drawback of allowing the appearance of stray capacitances in particular between the inputs of the charge amplifier 43 and its supply Gnd. Moreover, this problem appears for all the components powered in this way, such as for example a scanner.

A floating bridge capacitive measuring system such as described in FIG. 5 makes it possible in particular to produce touch-sensitive or contactless interfaces for devices such as mobile telephones (smartphones), tablets, computers, proximity detectors, control pads or 3D capacitive cameras. The electrodes 40 can be transparent electrodes, for example made of ITO (tin-doped indium oxide), deposited on a display screen or a touch pad. They are then used for detecting the approach and/or contact of a command object 41 such as a finger.

In this case, the integration of the electronics in the form of integrated circuits or of ASICs having minimum overall dimensions is fundamental and the invention assumes all of its importance.

The energy that an excitation source 3 can provide for supplying the electronics D1 is often sufficient because present-day techniques make it possible to produce integrated circuits having very low energy consumption: it is possible to produce an integrated circuit where the floating electronics consume only a few mW. Moreover, the minimizing of electrical consumption is an important constraint for uses in portable devices.

In order to produce an integrated circuit with high capacitive performance, with capacitive leakages reduced to the minimum, it is preferable to integrate two separate components in the integrated circuit, one of which is for the floating part D1 and the other of which is for the non-floating part D2. The two areas can also be separated by a shielding at the reference potential of the floating part.

The connection 2 between the output of the floating electronics D1 and the non-floating part D2 can be produced with coupling capacitors 9 using a digital transmission. The digital signals are preferably high rate signals, at high frequency, in order to use coupling capacitors 9 of low value so as not to overload the excitation source 3. It is also possible to use a differential amplifier powered by a power supply referenced to the ground 5 which retrieves the signals from the output of the floating electronics D1, whether they are analogue or digital.

The invention can also be used in very varied applications, among which can be mentioned in particular:
- all types of capacitive floating bridge electronics, with all types of signal processing such as filters, synchronous analogue or digital demodulations, analogue/digital converters (ADC), servo-control devices for producing bridges for measuring capacitance C or inverse capacitance I/C, switch controls for sequentially scanning several electrodes;
- all measurement systems, capacitive or based on another physical principle, comprising a part having a floating or variable potential;—applications where it is necessary to limit stray AC currents between systems and provide electromagnetic interference (EMI) protection;
- all applications requiring the interconnection of electronic systems of which all the reference voltages or some of the reference voltages are floating with AC potential differences;—all electronic systems comprising parts referenced to different potentials, one energized with respect to the other by an excitation source 3, these reference potentials being able to all be floating or variable with respect to a ground or a earth, and the excitation source 3 being able to be referenced to a potential connected to a ground or a earth or floating with respect to a earth or a ground.

Of course, the invention is not limited to the examples which have just been described and numerous adjustments can be made to these examples without exceeding the scope of the invention.

The invention claimed is:

1. An apparatus for touch and proximity detection, comprising:
   an integrated circuit including:
      a first electronic system, electrically referenced to a guard potential, configured for capacitively detecting one or more objects at one or more capacitive electrodes; and
      a second electronic system, distinct from the first electronic system and electrically referenced to a ground potential, and connected to the first electronic system by decoupling circuitry, wherein the ground potential is different from the guard potential; and excitation circuitry connected to the guard and ground potentials so as to impose an AC voltage difference between these potentials, wherein:

the decoupling circuitry is configured for communicatively coupling the first electronic system and the second electronic system while maintaining isolation between the guard potential and the ground potential, and the excitation circuitry comprises:

an AC voltage supply source referenced to the ground potential and configured for generating an AC voltage; and voltage supply circuitry referenced to the guard potential and configured for receiving the AC voltage from the AC voltage supply source and generating a supply voltage for the first electronic system referenced to the guard potential.

2. The apparatus of claim 1, wherein the voltage supply circuitry includes a voltage rectification and filtering circuit coupled between the AC voltage supply source and the second electronic system for generating the supply voltage.

3. The apparatus of claim 1, the AC voltage supply source comprising a first excitation source for generating the AC voltage difference between the guard potential and the ground potential.

4. The apparatus of claim 1, wherein the decoupling circuity includes decoupling capacitors coupled between the first electronic system and the second electronic system.

5. The apparatus of claim 3, the AC voltage supply source further comprising a second excitation source for generating the supply voltage.

6. The apparatus of claim 1, the first electronic measurement system comprising one or more electrodes referenced to the guard potential.

7. The apparatus of claim 6, the first electronic measurement system comprising one or more guard electrodes placed in proximity to the one or more electrodes and referenced to the guard potential.

8. The apparatus of claim 1, wherein the apparatus is incorporated into a portable computing device.

9. The apparatus of claim 1, further comprising one or more electrodes referenced to the guard potential and configured to shield the first electronic system.

10. A method for touch and proximity detection, comprising:

referencing a first electronic system to a guard potential;

referencing a second electronic system to a ground potential, different than the guard potential, and communicatively coupling the second electronic system to the first electronic system while maintaining isolation between the guard potential and the ground potential;

capacitively detecting one or more objects at one or more capacitive electrodes using the first electronic system; and maintaining an AC voltage difference between the guard potential and the ground potential, including:

generating an AC voltage referenced to the ground potential; and using the AC voltage to generate a supply voltage for the first electronic system referenced to the guard potential.

11. The method of claim 10, further comprising voltage rectifying and filtering the AC voltage to generate the supply voltage.

12. The method of claim 10, further comprising generating the AC voltage difference between the guard potential and the ground potential using a first excitation source.

13. The method of claim 10, further comprising decoupling electrical connections between the first electronic system and the second electronic system.

14. The method of claim 12, further comprising generating the power supply voltage using a second excitation source.

15. The method of claim 10, further comprising performing touch and proximity detection using one or more electrodes referenced to the guard potential.

16. The method of claim 15, further comprising placing one or more guard electrodes in proximity to the one or more electrodes and referencing the one or more guard electrodes to the guard potential.

* * * * *